US008058631B2

(12) United States Patent
Niwayama et al.

(10) Patent No.: US 8,058,631 B2
(45) Date of Patent: Nov. 15, 2011

(54) SEMICONDUCTOR MANUFACTURING APPARATUS

(75) Inventors: Masahiko Niwayama, Kyoto (JP); Kenji Yoneda, Kyoto (JP)

(73) Assignee: Panasonic Corporation, Osaka (JP)

( * ) Notice: Subject to any disclaimer, the term of this patent is extended or adjusted under 35 U.S.C. 154(b) by 95 days.

(21) Appl. No.: 12/637,272

(22) Filed: Dec. 14, 2009

(65) Prior Publication Data
US 2010/0093113 A1 Apr. 15, 2010

Related U.S. Application Data

(63) Continuation of application No. 11/905,227, filed on Sep. 28, 2007, now abandoned.

(30) Foreign Application Priority Data

Jan. 5, 2007 (JP) ................................. 2007-000520

(51) Int. Cl.
*G01K 1/08* (2006.01)
*H01J 3/26* (2006.01)
(52) U.S. Cl. .................... 250/492.21; 250/397; 250/398; 250/492.3
(58) Field of Classification Search .................. 250/397, 250/398, 492.21, 492.3
See application file for complete search history.

(56) References Cited

U.S. PATENT DOCUMENTS

| | | | | |
|---|---|---|---|---|
| 4,840,756 A | * | 6/1989 | Ebersole et al. | 264/485 |
| 5,136,181 A | * | 8/1992 | Yukawa | 327/143 |
| 5,286,978 A | * | 2/1994 | Yoshida et al. | 250/492.21 |
| 5,326,980 A | * | 7/1994 | Tajima et al. | 250/492.21 |
| 6,043,499 A | * | 3/2000 | Seki et al. | 250/492.21 |
| 6,451,674 B1 | | 9/2002 | Niwayama et al. | |
| 6,633,047 B2 | * | 10/2003 | Niwayama et al. | 250/492.21 |
| 6,821,682 B1 | * | 11/2004 | Stearns et al. | 430/5 |
| 7,038,223 B2 | * | 5/2006 | Starcher | 250/492.21 |
| 7,118,657 B2 | * | 10/2006 | Golovchenko et al. | 204/192.3 |

(Continued)

FOREIGN PATENT DOCUMENTS

JP 7-221306 8/1995

(Continued)

OTHER PUBLICATIONS

Kubo, H., et al., "Quantitative Charge Build-Up Evaluation Technique by Using MOS Capacitors with Charge Collecting Electrodes in Wafer Processing", IEICE Transactions on Electronics, Feb. 1996, pp. 198-205, vol. E79-C.

(Continued)

*Primary Examiner* — David A Vanore
(74) *Attorney, Agent, or Firm* — McDermott Will & Emery LLP

(57) ABSTRACT

A semiconductor manufacturing includes: an ion source and a beam line for introducing an ion beam into a target film which is formed over a wafer with an insulating film interposed therebetween; a flood gun for supplying the target film with electrons for neutralizing charges contained in the ion beam; a rotating disk for subjecting the target film to mechanical scanning of the ion beam in two directions composed of r-θ directions; a rear Faraday cage for measuring the current density produced by the ion beam; a disk-rotational-speed controller and a disk-scanning-speed controller for changing the scanning speed of the target film; and a beam current/current density measuring instrument for controlling, according to the current density, the scanning speed of the target film.

36 Claims, 8 Drawing Sheets

U.S. PATENT DOCUMENTS

| | | | |
|---|---|---|---|
| 7,212,282 B2 * | 5/2007 | Hau-Riege | 356/237.5 |
| 7,332,030 B2 * | 2/2008 | Bruel | 117/91 |
| 7,365,324 B2 * | 4/2008 | Noji et al. | 250/310 |
| 7,491,953 B2 * | 2/2009 | Horsky et al. | 250/492.21 |
| 7,520,956 B2 * | 4/2009 | Samukawa et al. | 156/345.28 |
| 7,605,382 B2 * | 10/2009 | Yamashita et al. | 250/492.21 |
| 7,638,782 B2 * | 12/2009 | Yoneda et al. | 250/492.21 |
| 2005/0184254 A1 * | 8/2005 | Matsumoto et al. | 250/492.21 |
| 2006/0163498 A1 | 7/2006 | Yoneda et al. | |

FOREIGN PATENT DOCUMENTS

| | | |
|---|---|---|
| JP | 11-307039 | 11/1999 |
| JP | 2006-210425 | 8/2006 |

OTHER PUBLICATIONS

Niwayama, M., et al., "A Study of Charge Neutralization Method during High Current Ion Implantation for Ultra Thin Gate Dielectrics", IEEE, 1999, pp. 598-601.

* cited by examiner

SEMICONDUCTOR MANUFACTURING APPARATUS

CROSS-REFERENCE TO RELATED APPLICATIONS

This application is a Continuation of U.S. application Ser. No. 11/905,227, filed on Sep. 28, 2007 now abandoned, claiming priority of Japanese Patent Application No. 2007-000520, filed on Jan. 5, 2007, the entire contents of each of which are hereby incorporation by reference.

BACKGROUND OF THE INVENTION (a) Fields of the Invention

The present invention relates to semiconductor manufacturing apparatus for injecting impurities into semiconductor devices with insulating films.

(b) Description of Related Art

In recent years, thickness reduction of a gate insulating film as well as miniaturization of a semiconductor element has been advancing. Thus, the possibility is growing that the gate insulating film is damaged during device fabrication processes to cause dielectric breakdown.

For example, in an ion implantation process, an ion beam with a positively charged energy is directly implanted into a semiconductor element surface and a wafer (semiconductor substrate) surface, so that the surface of the formed semiconductor device is easily charged positively. If the charge quantity implanted by the ion beam exceeds a fixed value, that is, the breakdown charge quantity $Q_{bd}$ specific to a gate insulating film, breakdown of the insulating film occurs (see, for example, Hiroko KUBO et al., "Quantitative Charge Build-Up Evaluation Technique by Using MOS Capacitors with Charge Collecting Electrode in Wafer Processing", IEICE Transactions on Electronics Vol. E79-C No. 2, pp. 198-205, February 1996). Since this device generally has a so-called antenna structure in which the area of a gate electrode portion is greater than the area of the gate insulating film, dielectric breakdown is likely to occur. Furthermore, this breakdown occurs more easily as the antenna ratio which is the ratio between the area of the gate electrode and the area of the gate insulating film is higher.

It is known that the breakdown by an ion beam occurs more easily as the beam current density during ion implantation is higher and that the breakdown occurs more significantly as the acceleration energy is higher. To deal with such characteristics, a proposal is made that the acceleration energy and the beam current as the ion implantation condition are set at values equal to or less than the breakdown charge quantity $Q_{bd}$ of the gate insulating film, thereby avoiding dielectric breakdown caused by charge build-up (see, for example, Japanese Unexamined Patent Publication No. H7-221306 (referred hereinafter to as Patent Document 1)).

On the other hand, a flood gun system is known which prevents positive charge build-up in the manner in which in order to prevent positive charge build-up induced by an ion beam, electrons together with the ion beam are supplied during ion implantation to neutralize positive charges. However, it is also known that since this flood gun system also supplies negative charges (electrons) directly to the surface of the semiconductor device, the resulting semiconductor surface is negatively charged to cause breakdown by negative charge build-up. To deal with such disadvantages, an approach is reported that energies of electrons supplied from the flood gun system are suppressed to a lower value, thereby reducing negative charge build-up of the surface of the semiconductor element to a fixed value equal to or less than the breakdown voltage (see, for example, Japanese Patent No. 3202002 (referred hereinafter to as Patent Document 2)).

Although the approach disclosed by Patent Document 2 reduces breakdown of the gate insulating film caused by negative charge build-up resulting from the flood gun system, breakdown of the gate insulating film caused by positive charge build-up resulting from the ion beam is still not completely prevented. The reason for this is as follows: even though electrons are supplied from the flood gun system during ion implantation, the potential at the moment when the ion beam is radiated onto the wafer is not completely neutralized and the potential distribution determined by the ion beam and the electrons is still present thereon. Therefore, as described above, charge build-up occurs depending on not only the beam current and the acceleration energy of the ion beam but also the scanning speed of the ion beam onto the wafer. Among others, the inventors found that the charge build-up condition by the ion beam greatly differs depending on the beam scanning speed.

Beam scanning methods include: the method in which with a wafer fixed, an ion beam is electrostatically or electromagnetically scanned two-dimensionally in X-Y directions; the method in which with an ion beam electrostatically or electromagnetically scanned one-dimensionally in one direction, a wafer is subjected to mechanical scanning in the perpendicular direction to the ion beam scanning direction and one-dimensionally in one direction; and the r-θ scanning method in which while an ion beam is fixed and a rotating disk with a wafer held thereon is being rotated, one-dimensional scanning is carried out in the radial direction of the disk. Other than these methods, various types of methods, such as the method in which with an ion beam fixed, a wafer is subjected to mechanical scanning two-dimensionally in X-Y directions, are used. Therefore, the relative linear speed between the ion beam and the wafer greatly differs depending on a beam scanning method used. As shown above, since various types of scanning speeds ranging from an extremely low-speed scanning to an extremely high-speed scanning are present, a method for reducing positive charge build-up regardless of these scanning speeds and methods is demanded.

SUMMARY OF THE INVENTION

The inventors have found that positive charge build-up induced by an ion beam in ion implantation causes critical damages to a semiconductor device, such as dielectric breakdown or insulation degradation of a gate insulating film, junction breakdown of a pn junction, or degradation of a junction interface.

As shown above, typically, in order to neutralize positive charge build-up by an ion beam, electrons with negative charges are supplied by a flood gun to the vicinity of the ion beam. However, since even the flood gun causes negative charge build-up, the flood gun may damage the semiconductor device depending on its condition. To deal with this problem, Patent Document 2 discloses the technique that where the thickness of the gate insulating film is set at t (nm), an electronic flood gun capable of suppressing the maximum energy of electrons supplied to 2t (eV) or smaller is used to reduce damages by the flood gun. Therefore, by employing the flood gun condition in Patent Document 2, at least excessive negative charge build-up induced by the flood gun can be avoided regardless of the device structure.

However, since positive charge build-up is induced by a positive ion beam injected, the acceleration energy of the ion beam is set at a value corresponding to the design value of a process to be used. Therefore, the value of the acceleration energy cannot be uniquely defined like the electron energy of the flood gun described above. For example, by a process design, the acceleration energy of a positive ion beam is set at a typical value of 100 eV to several hundreds of electron volts, in some cases at several mega-electron-volts. A positive ion beam current is also set at several hundreds of microamperes to several tens of milliamperes according to its dose. Thus, charge build-up by a positive ion beam greatly depends on the beam current density and the beam acceleration energy. This is described also in Patent Document 1.

It has been heretofore considered that in general, when electrons from a flood gun are radiated to a positive ion beam current, the positive ion beam is neutralized by the electrons. However, the inventors made detailed analyses of the surface potential of the wafer surface subjected to ion implantation, and then have found that the positive ion beam is not neutralized by negative electrons but as shown in FIG. 9A, electrons 102 emitted from the flood gun merely surround the positive ion beam 101.

To be more specific, referring to FIG. 9B, when a positive ion beam passes through a surface of a wafer 103, the wafer 103 is first charged up negatively by the electrons 102 surrounding the positive ion beam 101. Subsequently, it is charged up positively by the positive ion beam 101, and then is charged up negatively again by the electrons 102 surrounding the positive ion beam. Accordingly, neutralization of positive charge build-up by the flood gun is attained in the manner in which the surface potential having been once raised by the positive ion beam 101 is decreased by the electrons supplied subsequently by the flood gun. As is apparent from the above, neutralization of positive charge build-up by electrons from the flood gun is not neutralization of positive charge build-up by electrons made simultaneously during ion beam radiation but merely an apparent neutralization made so that the surface potential once charged up positively is changed again to the original potential by electrons from the flood gun.

As shown in FIG. 10A, the surface potential, which has a negative potential 105 provided by the flood gun 102, temporarily rises to a positive potential 106 by the positive ion beam 101. The rate dV/dt of the potential change at this time is determined by the ion energy and the beam current density. The ultimately-raised potential is determined by the time required for the beam to pass through one point on the wafer. From this, if the ion beam is kept radiated at one point, the potential rises to finally exceed the breakdown voltage 107 of the gate insulating film.

On the other hand, when the potential exceeds the breakdown voltage 107 of the gate insulating film, a tunneling current starts to flow through the gate insulating film. This in turn slows the rise in the surface potential, but an excessive current still continues to flow through the gate insulating film and finally leads to dielectric breakdown. That is to say, since at an arbitrary point on the wafer, the beam is always moving by scan to positively charge up the surface potential thereof, it is necessary to neutralize the positive charge build-up voltage by the flood gun before this voltage reaches the breakdown voltage 107. This significantly occurs in the case where the scanning speed of the ion beam, that is, the relative speed of the ion beam to one point on the wafer is lower than a predetermined value. To be more specific, if the relative speed of the ion beam to one point on the wafer is lower than a predetermined value, much time is spent on passage of the ion beam. Therefore, during this passage, the surface potential of the wafer continues to rise according to the beam current density, finally leading to dielectric breakdown or damage of the gate insulating film. As is apparent from the above, in neutralization of positive charge build-up by the flood gun, electrons are supplied after the gate insulating film is damaged or broken down by the positive charge build-up, so that such approach cannot actually neutralize the positive charge build-up.

In the case of a so-called r-θ scanning apparatus as shown in FIG. 10B in which the fixed positive ion beam 101 and a rotating disk 104 holding a plurality of wafers 103 are provided and the rotating disk 104 allows mechanical scanning in the Y direction, constraints of the scanning mechanism and the process conditions of the scanning apparatus determine the rotational speed of the rotating disk 104. Therefore, it is desirable to be able to suppress, regardless of the scanning mechanism of the ion beam 101, positive charge build-up at a closer side at which the ion beam 101 is produced.

An object of the present invention is to solve the conventional problems described above and to enable, regardless of an ion-beam scanning method, suppression of positive charge build-up to a semiconductor device formed on a wafer.

To attain the above object, the inventors made various evaluations. Their results will be described below.

FIG. 11A shows the relation between the rate of breakdown of a gate insulating film on a scanned wafer and the relative speed of an ion beam to the wafer, which is obtained when the relative speed and the maximum beam current density of the ion beam are changed according to various conditions. In FIG. 11A, the horizontal axis represents the relative speed (scanning speed) of the ion beam to the wafer and the vertical axis represents the rate of breakdown of the gate insulating film. In this evaluation, the maximum energy of electrons supplied from a flood gun in order to neutralize positive charges of the ion beam is kept at 2t (eV) or smaller with respect to the thickness t (nm) of the gate insulating film.

As can be understood from FIG. 11A, as the maximum beam current density of the ion beam is higher, it is necessary to increase the relative speed of the ion beam to the wafer in order to suppress positive charge build-up.

FIG. 11B shows the relation between the beam current density standardized by the scanning speed and the rate of breakdown of the gate insulating film on the wafer. In other words, FIG. 11B is a graph obtained by standardizing the beam current density in FIG. 11A by the scanning speed and then plotting the standardized value. As can be understood from FIG. 11B, under the condition for suppressing negative charge build-up induced by electrons supplied from the flood gun, the rate of breakdown of the gate insulating film caused by positive charge build-up does not depend on the maximum beam current density of the radiated ion beam, but only on "the value obtained by dividing the maximum beam current density by the scanning speed." That is to say, the inventors have found that positive charge build-up induced by the ion beam can be suppressed by satisfying the following equation (1):

(the maximum beam current density [A/m$^2$] of an ion beam)/(the relative speed [m/s] of the ion beam to a wafer)≦5          Equation (1)

Although depending on the beam scanning method, the relative speed of an ion beam to a wafer is limited to a certain range, it is possible to determine the maximum beam current density of an available ion beam. In contrast to this, it is found that if the maximum beam current density of an ion beam desired to be used during ion implantation is determined, the relative speed of the ion beam to the wafer should be determined uniquely.

The present invention has been made based on the above findings. To be more specific, the present invention is implemented by the constructions that follow.

A first semiconductor manufacturing apparatus according to the present invention is characterized in that the apparatus includes: impurity introduction means for introducing impurities with charges into a target film which is formed over a semiconductor substrate with an insulating film interposed therebetween; electron supply means for supplying the target film with electrons for neutralizing the charges contained in the impurities; scanning means for subjecting the target film to mechanical scanning of the impurities in two directions composed of X-Y directions or r-θ directions; current density measurement means for measuring the current density J (A/m$^2$) produced by the impurities; scanning speed changing means for changing the scanning speed of the target film; and scanning speed control means for controlling, according to the current density J (A/m$^2$), the scanning speed of the target film.

With the first semiconductor manufacturing apparatus, in the case of providing the scanning means for allowing mechanical scanning in two directions, the scanning speed control means for controlling the scanning speed of the target film according to the current density J (A/m$^2$) is included. Therefore, the electron supply means (a flood gun) can supply electrons before by positive charge build-up, the surface potential reaches the breakdown voltage. This prevents positive charge build-up of the target film or the semiconductor substrate formed with the target film. That is to say, regardless of an ion beam scanning method employed, positive charge build-up of the semiconductor device formed on the semiconductor substrate can be suppressed.

Preferably, in the first semiconductor manufacturing apparatus, the scanning speed control means controls, according to the current density J (A/m$^2$), the scanning speed of the target film to a predetermined value or more.

Preferably, in the above case, the predetermined value of the scanning speed of the target film is J/5 (m/s), which is obtained from the equation (1).

A second semiconductor manufacturing apparatus according to the present invention is characterized in that the apparatus includes: impurity introduction means for introducing impurities with charges into a target film which is formed over a semiconductor substrate with an insulating film interposed therebetween; electron supply means for supplying the target film with electrons for neutralizing the charges contained in the impurities; scanning means for subjecting the target film to mechanical scanning of the impurities in two directions composed of X-Y directions or r-θ directions; current density measurement means for measuring the current density produced by the impurities; scanning speed measurement means for measuring the scanning speed v (m/s) of the target film; scanning speed control means for controlling the scanning speed of the target film; first current density control means for controlling the amount of generation of the impurities and the current density produced by the impurities; and second current density control means for controlling the current density according to the scanning speed v (m/s).

With the second semiconductor manufacturing apparatus, in the case of providing the scanning means for allowing mechanical scanning in two directions, the second current density control means for controlling the current density according to the scanning speed v (m/s) is included. Therefore, the electron supply means (a flood gun) can supply electrons before by positive charge build-up, the surface potential reaches the breakdown voltage. This prevents positive charge build-up of the target film or the semiconductor substrate formed with the target film. That is to say, regardless of an ion beam scanning method employed, positive charge build-up of the semiconductor device formed on the semiconductor substrate can be suppressed.

Preferably, in the second semiconductor manufacturing apparatus, the second current density control means controls, according to the scanning speed v (m/s), the impurity current density to a value greater than zero and not greater than a predetermined value.

Preferably, in the above case, the predetermined value of the current density is 5v (A/m$^2$), which is obtained from the equation (1).

Preferably, in the second semiconductor manufacturing apparatus, if the current density is greater than 5v (A/m$^2$), the second current density control means controls the scanning means to temporarily stop the impurity introduction operation, and when the current density is controlled to a value equal to or smaller than 5v (A/m$^2$), the impurity introduction operation is started again.

Preferably, in the first or second semiconductor manufacturing apparatus, the impurity introduction means is ion implantation means for implanting ions as the impurities.

Preferably, the first or second semiconductor manufacturing apparatus further comprises: electronic energy control means for controlling energies of electrons supplied by the electron supply means; and electronic energy measurement means for measuring energies of electrons supplied by the electron supply means.

Preferably, in the above case, the electronic energy measurement means measures the maximum energy of electrons supplied by the electron supply means.

Preferably, in the above case, the electronic energy measurement means controls the electronic energy control means based on the measured electron energy so that the maximum energy of electrons supplied by the electron supply means is set at a predetermined value or less.

Preferably, in the first or second semiconductor manufacturing apparatus, the insulating film has a thickness of t (nm), and the electronic energy control means controls the maximum electron energy to a value greater than 0 (eV) and not greater than 2t (eV).

A third semiconductor manufacturing apparatus according to the present invention is characterized in that the apparatus includes: impurity introduction means for introducing impurities with charges into a target film which is formed over a semiconductor substrate with an insulating film interposed therebetween; electron supply means for supplying the target film with electrons for neutralizing the charges contained in the impurities; first scanning means for subjecting the target film to mechanical scanning of the impurities in one direction; first scanning speed changing means for changing the scanning speed of the target film; second scanning means for allowing the impurities to perform scanning in the vertical direction with respect to one said direction; second scanning speed changing means for changing the scanning speed of the impurities; current density measurement means for measuring the current density J (A/m$^2$) produced by the impurities; and scanning speed control means for controlling, according to the current density J (A/m$^2$), the scanning speed of the target film and the scanning speed of the impurities.

With the third semiconductor manufacturing apparatus, in the case of providing the scanning means for allowing mechanical scanning in one direction, the scanning speed control means for controlling the scanning speed of the target film and the scanning speed of the impurities according to the current density J (A/m$^2$) is included. Therefore, the electron supply means (a flood gun) can supply electrons before by positive charge build-up, the surface potential reaches the breakdown voltage. This prevents positive charge build-up of the target film or the semiconductor substrate formed with the target film. That is to say, regardless of an ion beam scanning method employed, positive charge build-up of the semiconductor device formed on the semiconductor substrate can be suppressed.

Preferably, in the third semiconductor manufacturing apparatus, the scanning speed control means controls, according to the current density J ($A/m^2$), the scanning speed of the impurities to a predetermined value or more.

Preferably, in the above case, the predetermined value of the scanning speed of the impurities is J/5 (m/s).

Preferably, in the third semiconductor manufacturing apparatus, the scanning speed control means controls, according to the current density J ($A/m^2$) of the impurities, the scanning speed of the impurities and the scanning speed of the target film to a predetermined value or greater.

Preferably, in the third semiconductor manufacturing apparatus, the scanning speed control means controls the relative speed of the impurities to the target film to a value of J/5 (m/s) or higher, the relative speed being determined by the scanning speed of the impurities and the scanning speed of the target film.

A fourth semiconductor manufacturing apparatus according to the present invention is characterized in that the apparatus includes: impurity introduction means for introducing impurities with charges into a target film which is formed over a semiconductor substrate with an insulating film interposed therebetween; electron supply means for supplying the target film with electrons for neutralizing the charges contained in the impurities; first scanning means for subjecting the target film to mechanical scanning of the impurities in one direction; first scanning speed measurement means for measuring the scanning speed of the target film; first scanning speed control means for controlling the scanning speed of the target film; second scanning means for allowing the impurities to perform scanning in the vertical direction with respect to one said direction; second scanning speed measurement means for measuring the scanning speed of the impurities; second scanning speed control means for controlling the scanning speed of the impurities; first current density control means for controlling the amount of generation of the impurities and the current density produced by the impurities; and second current density control means for controlling the impurity current density according to the relative speed v (m/s) of the impurities to the target film determined by the scanning speed of the impurities and the scanning speed of the target film.

With the fourth semiconductor manufacturing apparatus, in the case of providing the scanning means for allowing mechanical scanning in one direction, the second current density control means for controlling the impurity current density according to the relative speed v (m/s) of the impurities to the target film determined by the scanning speed of the impurities and the scanning speed of the target film is included. Therefore, the electron supply means (a flood gun) can supply electrons before by positive charge build-up, the surface potential reaches the breakdown voltage. This prevents positive charge build-up of the target film or the semiconductor substrate formed with the target film. That is to say, regardless of an ion beam scanning method employed, positive charge build-up of the semiconductor device formed on the semiconductor substrate can be suppressed.

Preferably, in the fourth semiconductor manufacturing apparatus, the second current density control means controls, according to the relative speed v (m/s), the impurity current density to a value greater than zero and not greater than a predetermined value.

Preferably, in the fourth semiconductor manufacturing apparatus, the first current density control means controls the current density produced by the impurities to 5v ($A/m^2$) or smaller.

Preferably, in the fourth semiconductor manufacturing apparatus, if the current density is greater than 5v ($A/m^2$), the second current density control means controls the scanning means to temporarily stop the impurity introduction operation, and when the current density is controlled to a value equal to or smaller than 5v ($A/m^2$), the impurity introduction operation is started again.

Preferably, in the third or fourth semiconductor manufacturing apparatus, the impurity introduction means is ion implantation means for implanting ions as the impurities.

Preferably, the third or fourth semiconductor manufacturing apparatus further comprises: electronic energy control means for controlling energies of electrons supplied by the electron supply means; and electronic energy measurement means for measuring energies of electrons supplied by the electron supply means.

Preferably, in the above case, the electronic energy measurement means measures the maximum energy of electrons supplied by the electron supply means.

Preferably, in the above case, the electronic energy measurement means controls the electronic energy control means based on the measured electron energy so that the maximum energy of electrons supplied by the electron supply means is set at a predetermined value or less.

Preferably, in the third or fourth semiconductor manufacturing apparatus, the insulating film has a thickness of t (nm), and the electronic energy control means controls the maximum electron energy to a value greater than 0 (eV) and not greater than 2t (eV).

As described above, the semiconductor manufacturing apparatus according to the present invention can suppress, regardless of an ion beam scanning method employed, positive charge build-up of the semiconductor device having the insulating film formed on the semiconductor substrate.

BEST MODE FOR CARRYING OUT THE INVENTION

First Embodiment

Using an ion implantation apparatus as an example, a semiconductor manufacturing apparatus according to a first embodiment of the present invention will be described with reference to the accompanying drawings.

Figure 1:
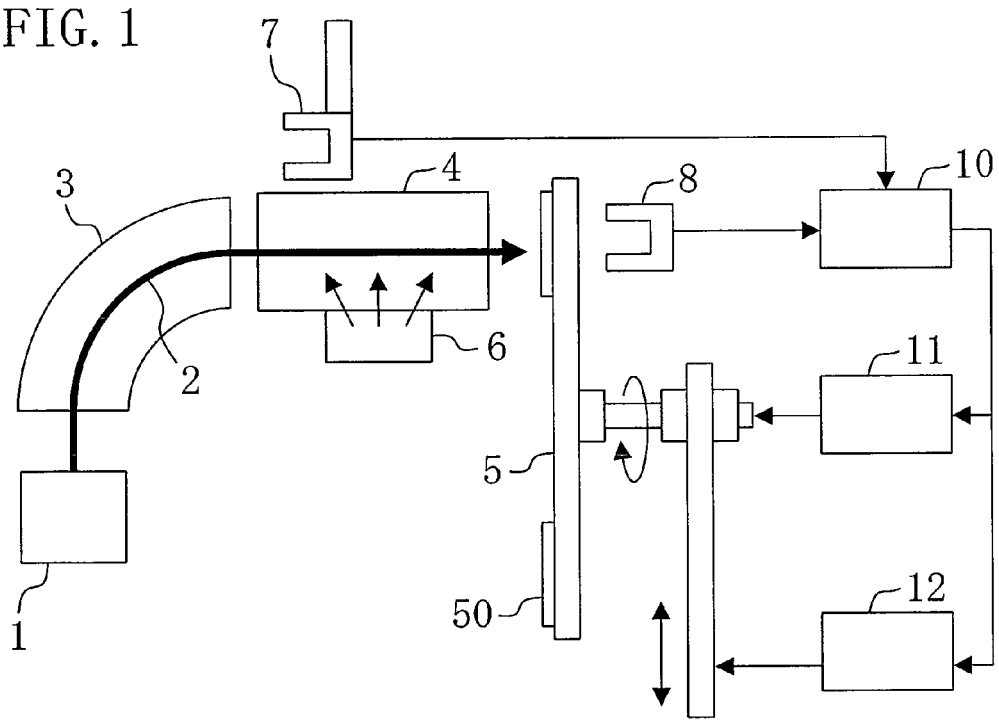
FIG. 1 is a schematic front view of a semiconductor manufacturing apparatus according to a first embodiment of the present invention.

FIG. 1 schematically shows the semiconductor manufacturing apparatus according to the first embodiment of the present invention. Referring to FIG. 1, the apparatus includes: an ion source 1 for generating ions to be implanted as impurity ions into a wafer 50; a mass analyzer 3 for selecting a predetermined ion species from an ion beam 2 drawn from the ion source 1; a beam line 4 for introducing the selected ion species into the wafer 50; and a rotating disk 5 for placing the multiple wafers 50 and circularly moving the wafers 50 in the state of placement on the placing surface of the disk. In this construction, although over the principal surface of the wafer 50, a target film into which the ions are to be introduced is formed with an insulating film such as a gate insulating film interposed therebetween, illustration of the insulating film and the target film is omitted.

The beam line 4 is provided with a flood gun 6 for supplying electrons to the ion beam 2 to suppress charge build-up. Preferably, the flood gun 6 is provided with an electronic energy controller for controlling energies of electrons supplied therefrom and an electronic energy measuring instrument for measuring energies of electrons, in particular a maximum energy of electrons supplied therefrom. Preferably, in this case, when the thickness of an insulating film formed over the wafer 50 is defined as t (nm), the electronic energy controller controls the maximum electron energy to a value greater than 0 (eV) and not greater than 2t (eV).

The rotating disk 5 is scannable in two-axis (r-θ) directions composed of rotational motion and reciprocating motion, and with this structure, the ion beam 2 is radiated over the entire surface of the principal surface of the wafer 50.

In the beam line 4, a front Faraday cage 7 is provided to be able to move into the path of the ion beam 2, and can measure the beam current and the beam current density obtained from the ion beam 2.

A rear Faraday cage 8 is provided at a location facing the beam line 4 with the rotating disk 5 interposed therebetween. The rear Faraday cage 8 can measure the beam current and the beam current density obtained from the ion beam 2 when ion implantation is being performed on the wafers 50. During measurement with the rear Faraday cage 8, the front Faraday cage 7 moves away from the path of the ion beam 2 and then stops and stays at a standby position shown in FIG. 1.

The front and rear Faraday cages 7 and 8 are electrically connected to a beam current/current density measuring instrument 10. Therefore, the beam current/current density measuring instrument 10 can obtain, in real time, the values of the beam current and the beam current density from the front Faraday cage 7 immediately before ion implantation or from the rear Faraday cage 8 during ion implantation.

To the rotating disk 5, a disk rotational speed controller 11 and a disk scanning speed controller 12 are electrically connected. The disk rotational speed controller 11 controls the rotational speed of the rotating disk 5, and the disk scanning speed controller 12 controls the scanning speed thereof.

From the obtained values of the beam current and the beam current density J (A/m$^2$) of the ion beam 2, the beam current/current density measuring instrument 10 calculates the rotational speed and the scanning speed of the rotating disk 5 so that the relative speed of the ion beam 2 to each of the wafers 50 is equal to or higher than a predetermined value, and then sends the resulting speed information to the disk rotational speed controller 11 and the disk scanning speed controller 12.

In general, during ion implantation, the beam current varies due to fluctuation or the like caused in the ion source 1. The rear Faraday cage 8 obtains, in real time, information on its variation and sends the obtained information to the beam current/current density measuring instrument 10. Then, an optimal rotational speed and an optimal scanning speed of the rotating disk 5 are calculated, and the calculation results are sent to the disk rotational speed controller 11 and the disk scanning speed controller 12. Thereby, control of the system is continued.

Figure 2:
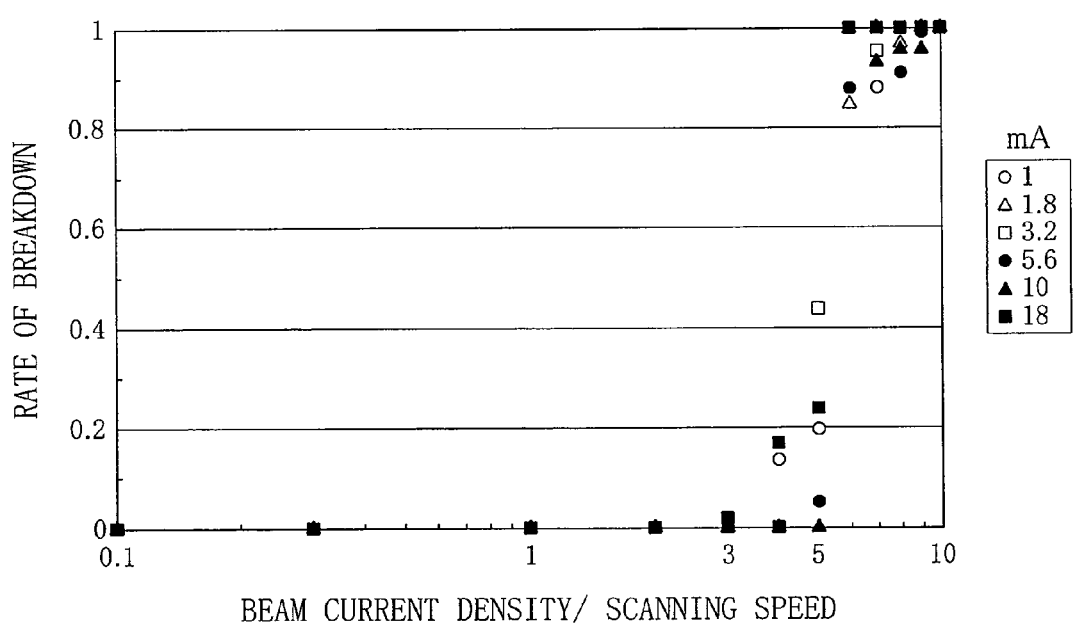
FIG. 2 is a graph showing the relation between the maximum beam current density of a beam standardized by the scanning speed (wherein the relative speed is fixed) and the rate of breakdown of a gate insulating film, which is obtained from the semiconductor manufacturing apparatus according to the first embodiment of the present invention.

FIG. 2 is a graph showing the relation between the maximum beam current density standardized by the scanning speed and the rate of breakdown of the gate insulating film. FIG. 2 shows the result of the relation measured at the time of the upper limit value of the scanning speed (relative speed) in the case where as the ion implantation condition, for example, an arsenic (As$^+$) ion is used as the ion species, the ion acceleration energy is set at 20 keV, and the maximum beam current is set at 1 mA, 1.8 mA, 3.2 mA, 5.6 mA, 10 mA, and 18 mA. The horizontal axis of the graph represents the value obtained by dividing the maximum current density of the ion beam 2 during the ion implantation by the upper limit value of the scanning speed, and the vertical axis thereof represents the rate of breakdown of the gate oxide film.

As can be seen from FIG. 2, if the value obtained by dividing the maximum beam current density of the ion beam 2 by the upper limit value of the scanning speed is 5 or smaller, breakdown of the gate oxide film can be suppressed.

Moreover, if the obtained value is 3 or smaller, breakdown of the gate insulating film can be nearly completely prevented.

That is to say, from the relation obtained by the equation (1), by setting the relative speed of the ion beam 2 to the wafer 50 at J/5 (m/s) or greater (where J is the maximum beam current density (A/m$^2$) of the ion beam 2), positive charge build-up by the ion beam 2 can be suppressed to prevent breakdown of the gate insulating film.

In the first embodiment, description has been made of the case where the ion implantation apparatus is used as an example. However, the apparatus used is not limited to this, and the same effects can be provided to an apparatus for introducing impurities with charges.

In the first embodiment, as the ion implantation condition, As$^+$ is used as the ion species, the ion acceleration energy is set at 20 keV, and the beam current is set at 1 to 18 mA. However, the ion implantation condition is not limited to this, and the ion species, the ion acceleration energy, the amount of ion implantation, and the beam current can be modified as appropriate.

In the first embodiment, description has been made of the case of the two-axis scan in the r-θ directions which uses the rotating disk 5 as means for holding the wafers 50 to subject the wafers to scanning motion. However, the scan is not limited to this, and the same effects can be provided to, for example, a method for fixing the path of the ion beam 2 and subjecting the wafers 50 to mechanical scanning in two or more-axis directions in order to radiate the ion beam 2 onto the entire surfaces of the wafers 50, such as two-axis scan in the x-y directions.

Second Embodiment

Using an ion implantation apparatus as an example, a semiconductor manufacturing apparatus according to a second embodiment of the present invention will be described below with reference to the accompanying drawings.

Figure 3:
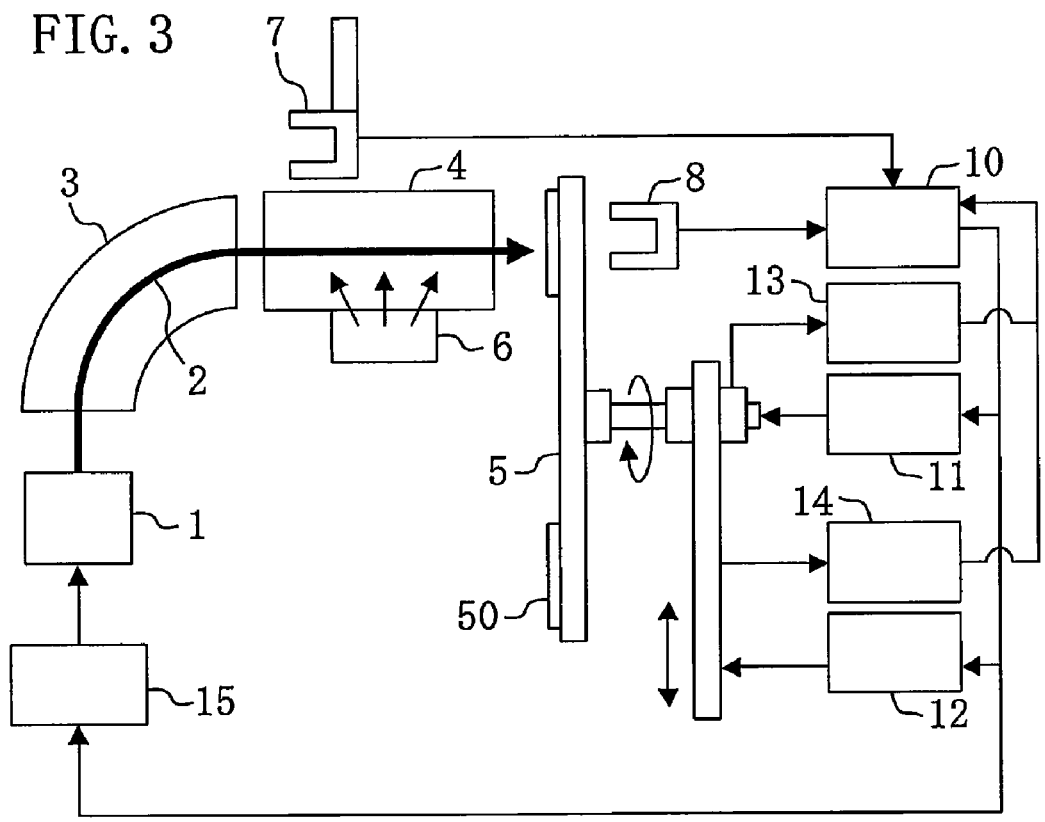
FIG. 3 is a schematic front view of a semiconductor manufacturing apparatus according to a second embodiment of the present invention.

FIG. 3 schematically shows the semiconductor manufacturing apparatus according to the second embodiment of the present invention. The description of the components shown in FIG. 3 that are the same as those shown in FIG. 1 will be omitted by retaining the same reference numerals.

Referring to FIG. 3, the second embodiment differs from the first embodiment in that: the rotating disk 5 is provided with a disk-rotational-speed measuring instrument 13 for measuring the rotational speed of the rotating disk 5 and a disk-scanning-speed measuring instrument 14 for measuring the scanning speed (in the r direction) of the rotating disk 5; and the ion source 1 is provided with an ion source regulator 15 for receiving a signal from the beam current/current density measuring instrument 10.

In the second embodiment, the disk-rotational-speed measuring instrument 13 measures the rotational speed of the rotating disk 5, and the disk-scanning-speed measuring instrument 14 measures the scanning speed of the rotating disk 5 (the moving speed of a scanning drive). The results of these measurements are sent in real time to the beam current/current density measuring instrument 10.

From the rotational speed and the scanning speed of the rotating disk 5 obtained from the disk-rotational-speed measuring instrument 13 and the disk-scanning-speed measuring instrument 14, respectively, the beam current/current density measuring instrument 10 calculates the actual relative speed of the ion beam 2 to the wafer 50, and then determines, from the calculated value, whether or not the maximum beam current density of the ion beam 2 currently used is equal to or smaller than a predetermined value. If it is judged to be equal to or smaller than the predetermined value, the same ion implantation is continued without changing anything. In contrast to this, if it is judged to be greater than the predetermined value, ion implantation is stopped temporarily and information on the implantation stop is sent to the ion source regulator 15. The ion source regulator 15 receives the implantation-stop information and then re-regulates the beam current and the beam current density of the ion beam 2. Thereafter, if the maximum beam current density of the ion beam 2 satisfies the predetermined value, ion implantation is started again.

As described above, in general, during ion implantation, the beam current varies due to fluctuation or the like caused in the ion source 1. The rear Faraday cage 8 obtains, in real time, information on its variation and sends the obtained information to the beam current/current density measuring instrument 10. Simultaneously with this, the disk-rotational-speed measuring instrument 13 and the disk-scanning-speed measuring instrument 14 continue to send the obtained rotational speed and scanning speed of the rotating disk 5 to the beam current/current density measuring instrument 10, respectively. The beam current/current density measuring instrument 10 determines, from the information on variation of the ion beam 2 and the rotational speed and the scanning speed of the rotating disk 5, whether or not the beam current density is a suitable value. Thereby, control of the system is continued.

Figure 4:
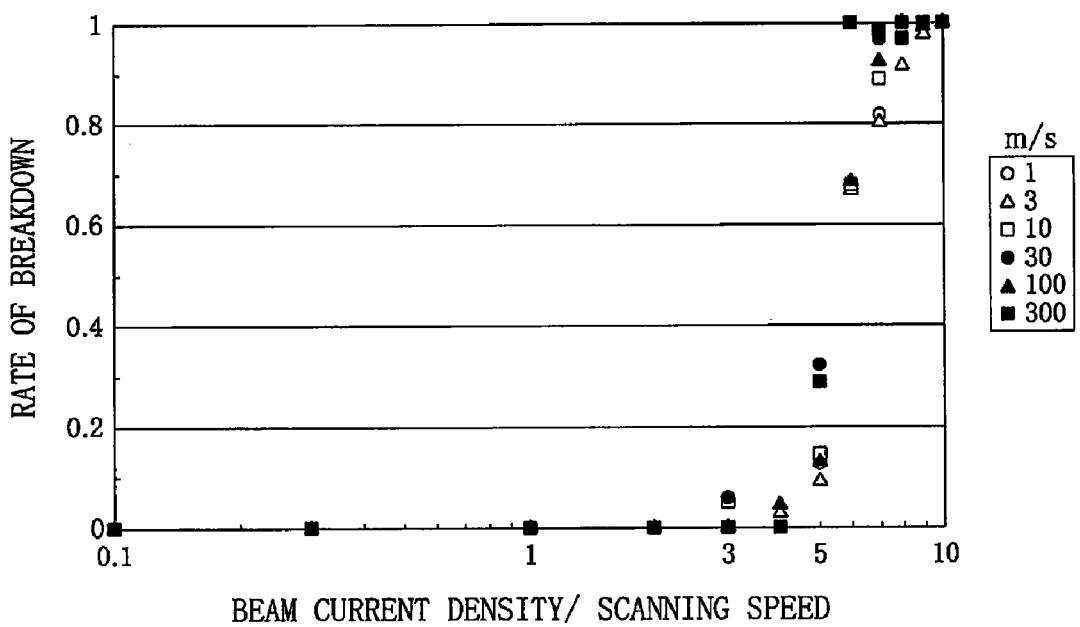
FIG. 4 is a graph showing the relation between the maximum beam current density of a beam standardized by the scanning speed and the rate of breakdown of a gate insulating film, which is obtained from the semiconductor manufacturing apparatus according to the second embodiment of the present invention.

FIG. 4 is a graph showing the relation between the maximum beam current density standardized by the scanning speed and the rate of breakdown of the gate insulating film. FIG. 4 shows the result of the relation measured by changing the upper limit value of the scanning speed (relative speed) to 1 m/s, 3 m/s, 10 m/s, 30 m/s, 100 m/s, and 300 m/s in the case where as the ion implantation condition, for example, an arsenic (As$^+$) ion is used as the ion species and the ion acceleration energy is set at 20 keV. The horizontal axis of the graph represents the value obtained by dividing the maximum current density of the ion beam 2 during the ion implantation by the upper limit value of the scanning speed, and the vertical axis thereof represents the rate of breakdown of the gate oxide film.

As can be seen from FIG. 4, if the value obtained by dividing the maximum beam current density of the ion beam 2 by the upper limit value of the scanning speed is 5 or smaller, breakdown of the gate oxide film can be suppressed. Moreover, if the obtained value is 3 or smaller, breakdown of the gate insulating film can be nearly completely prevented.

That is to say, from the relation obtained by the equation (1), by setting the maximum current density of the ion beam 2 at 5v (A/m$^2$) or smaller (where v is the relative speed (m/s) of the ion beam 2 to the wafer 50), positive charge build-up by the ion beam 2 can be suppressed to prevent breakdown of the gate insulating film.

In the second embodiment, description has been made of the case where the ion implantation apparatus is used as an example. However, the apparatus used is not limited to this, and the same effects can be provided to an apparatus for introducing impurities with charges.

In the second embodiment, as the ion implantation condition, As$^+$ is used as the ion species, and the ion acceleration energy is set at 20 keV. However, the ion implantation condition is not limited to this, and the ion species, the ion acceleration energy, and the amount of ion implantation can be modified as appropriate.

In the second embodiment, description has been made of the case of the two-axis scan in the r-θ directions which uses the rotating disk 5 as means for holding the wafers 50 to subject the wafers to scanning motion. However, the scan is not limited to this, and the same effects can be provided to, for example, a method for fixing the path of the ion beam 2 and subjecting the wafers 50 to mechanical scanning in two or more-axis directions in order to radiate the ion beam 2 onto the entire surfaces of the wafers 50, such as two-axis scan in the x-y directions.

Third Embodiment

Using an ion implantation apparatus as an example, a semiconductor manufacturing apparatus according to a third embodiment of the present invention will be described below with reference to the accompanying drawings.

Figure 5:
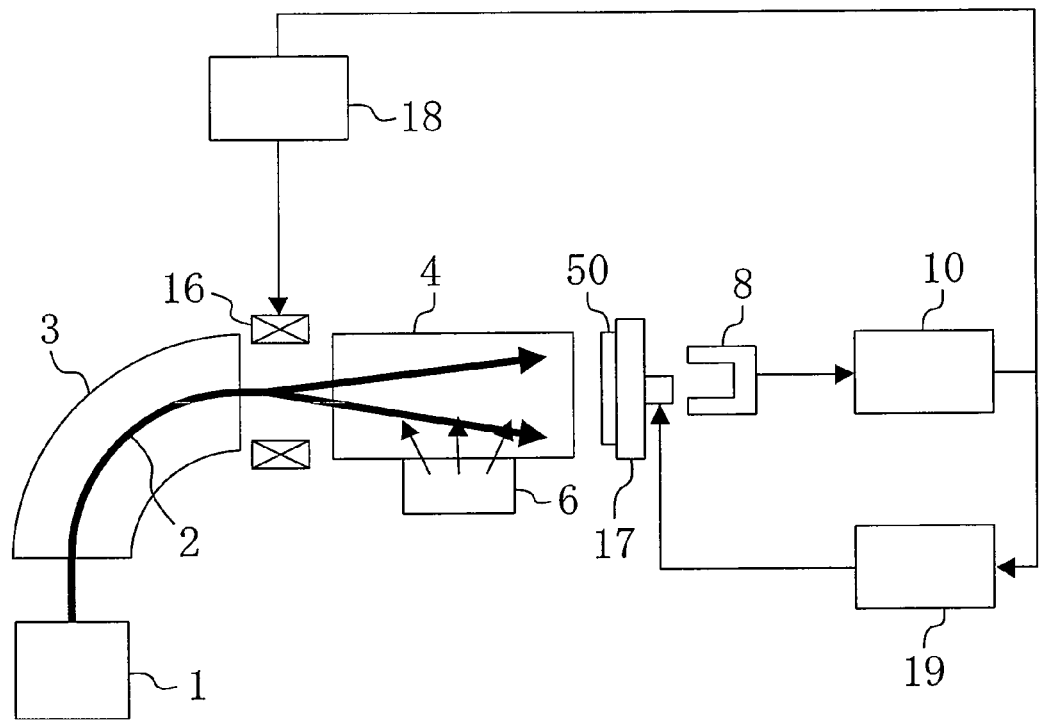
FIG. 5 is a schematic front view of a semiconductor manufacturing apparatus according to a third embodiment of the present invention.

FIG. 5 schematically shows the semiconductor manufacturing apparatus according to the third embodiment of the present invention. The description of the components shown in FIG. 5 that are the same as those shown in FIG. 1 will be omitted by retaining the same reference numerals.

Referring to FIG. 5, the third embodiment differs from the first embodiment in that: a beam scanning electrode 16 is provided between the mass analyzer 3 and the beam line 4; and as means for holding the wafer 50, a platen 17 movable in one direction is used instead of the rotating disk 5. Therefore, the disk rotational speed controller 11 and the disk scanning speed controller 12 are not provided in the third embodiment.

In this construction, to the beam scanning electrode 16, a beam-scanning-speed controller 18 is connected which receives control by the beam current/current density measuring instrument 10.

The platen 17 oscillates vertically with respect to the scanning direction of the ion beam 2, and thus the ion beam 62 is radiated onto the entire surface of the wafer 50. To the platen 17, a platen-moving-speed controller 19 is connected which receives control by the beam current/current density measuring instrument 10.

From the values of the beam current and the beam current density J ($A/m^2$) of the ion beam 2 obtained from the rear Faraday cage 8, the beam current/current density measuring instrument 10 calculates the scanning speed of the ion beam 2 and the moving speed of the platen so that the relative speed of the ion beam 2 to the wafer 50 is equal to or higher than a predetermined value, and then sends the resulting speed information to the beam-scanning-speed controller 18 and the platen-moving-speed controller 19.

As described above, in general, during ion implantation, the beam current varies due to fluctuation or the like caused in the ion source 1. The rear Faraday cage 8 obtains, in real time, information on its variation and sends the obtained information to the beam current/current density measuring instrument 10. Simultaneously with this, the beam current/current density measuring instrument 10 calculates an optimal beam scanning speed and an optimal platen moving speed, and sends the calculated results to the beam-scanning-speed controller 18 and the platen-moving-speed controller 19, respectively. Thereby, control of the system is continued.

Figure 6:
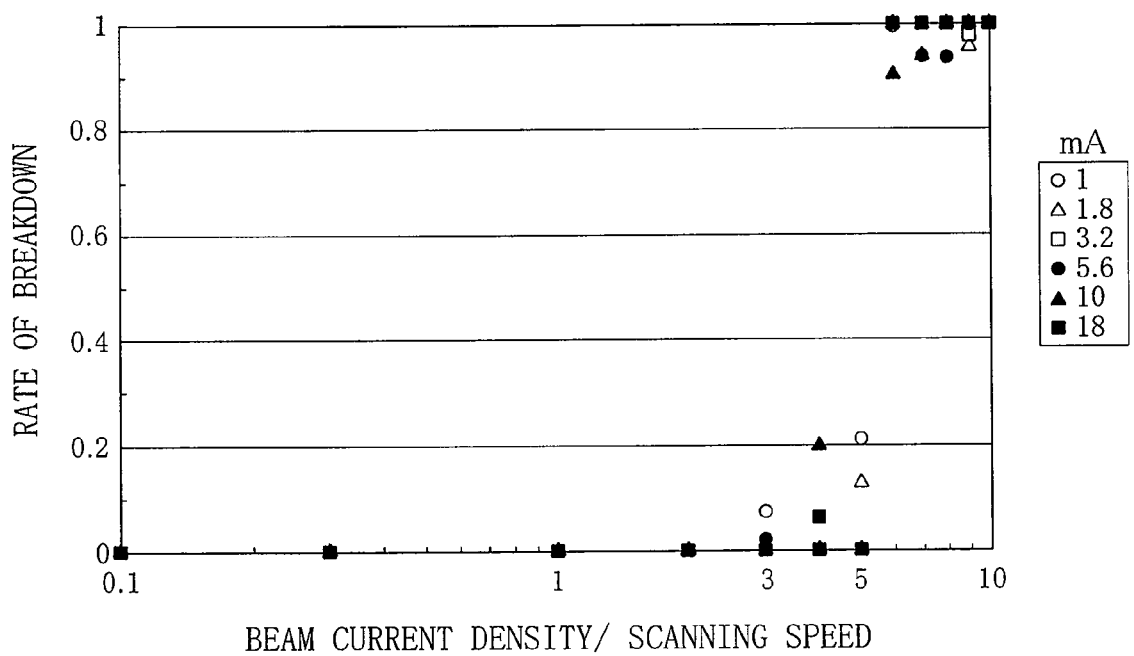
FIG. 6 is a graph showing the relation between the maximum beam current density of a beam standardized by the scanning speed (wherein the relative speed is fixed) and the rate of breakdown of a gate insulating film, which is obtained from the semiconductor manufacturing apparatus according to the third embodiment of the present invention.

FIG. 6 is a graph showing the relation between the maximum beam current density standardized by the scanning speed and the rate of breakdown of the gate insulating film.

FIG. 6 shows the result of the relation measured at the time of the upper limit value of the scanning speed (relative speed) in the case where as the ion implantation condition, for example, an arsenic ($As^+$) ion is used as the ion species, the ion acceleration energy is set at 20 keV, and the maximum beam current is set at 1 mA, 1.8 mA, 3.2 mA, 5.6 mA, 10 mA, and 18 mA. The horizontal axis of the graph represents the value obtained by dividing the maximum current density of the ion beam 2 during the ion implantation by the upper limit value of the scanning speed, and the vertical axis thereof represents the rate of breakdown of the gate oxide film.

As can be seen from FIG. 6, if the value obtained by dividing the maximum beam current density of the ion beam 2 by the upper limit value of the scanning speed is 5 or smaller, breakdown of the gate oxide film can be suppressed. Moreover, if the obtained value is 3 or smaller, breakdown of the gate insulating film can be nearly completely prevented.

That is to say, from the relation obtained by the equation (1), by setting the relative speed of the ion beam 2 to the wafer 50 at J/5 (m/s) or greater (where J is the maximum beam current density ($A/m^2$) of the ion beam 2), positive charge build-up by the ion beam 2 can be suppressed to prevent breakdown of the gate insulating film.

In the third embodiment, description has been made of the case where the ion implantation apparatus is used as an example. However, the apparatus used is not limited to this, and the same effects can be provided to an apparatus for introducing impurities with charges.

In the third embodiment, as the ion implantation condition, $As^+$ is used as the ion species, the ion acceleration energy is set at 20 keV, and the beam current is set at 1 to 18 mA. However, the ion implantation condition is not limited to this, the ion species, the ion acceleration energy, the amount of ion implantation, and the beam current can be modified as appropriate.

Fourth Embodiment

Using an ion implantation apparatus as an example, a semiconductor manufacturing apparatus according to a fourth embodiment of the present invention will be described below with reference to the accompanying drawings.

Figure 7:
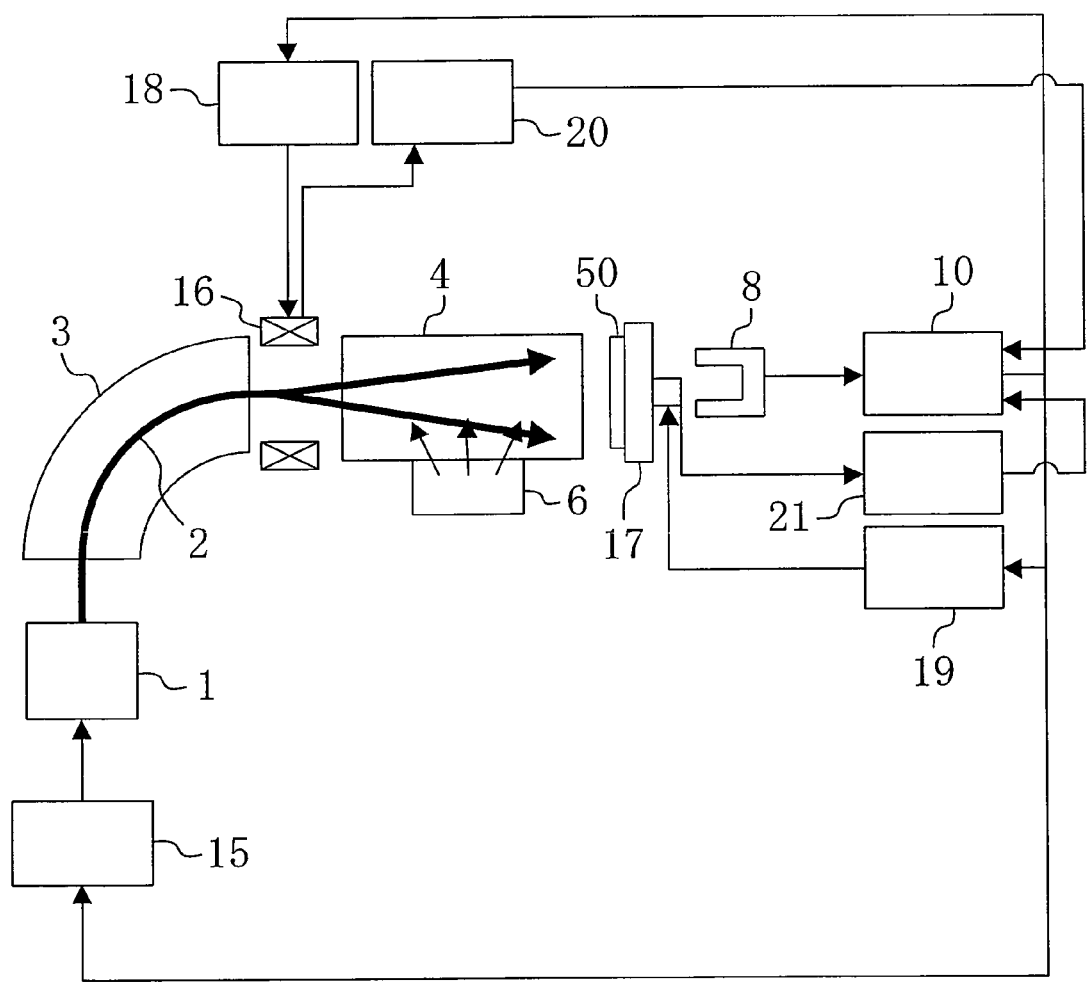
FIG. 7 is a schematic front view of a semiconductor manufacturing apparatus according to a fourth embodiment of the present invention.

FIG. 7 schematically shows the semiconductor manufacturing apparatus according to the fourth embodiment of the present invention. The description of the components shown in FIG. 7 that are the same as those shown in FIGS. 1 and 5 will be omitted by retaining the same reference numerals.

Referring to FIG. 7, the fourth embodiment differs from the second embodiment in that: the beam scanning electrode 16 is provided with a beam-scanning-speed measuring instrument 20 for measuring the scanning speed of the ion beam 2; the platen 17 is provided with a platen-moving-speed measuring instrument 21 for measuring the moving speed of the platen 17; and the ion source 1 is provided with the ion source regulator 15 for receiving a signal from the beam current/current density measuring instrument 10.

In the fourth embodiment, the beam-scanning-speed measuring instrument 20 measures the scanning speed of the ion beam 2 controlled by the beam scanning electrode 16, and the platen-moving-speed measuring instrument 21 measures the moving speed (oscillation speed) of the platen 17. The results of these measurements are sent in real time to the beam current/current density measuring instrument 10.

From the scanning speed of the ion beam 2 and the moving speed of the platen 17 obtained from the beam-scanning-speed measuring instrument 20 and the platen-moving-speed measuring instrument 21, respectively, the beam current/current density measuring instrument 10 calculates the actual relative speed of the ion beam 2 to the wafer 50, and then determines, from the calculated value, whether or not the maximum beam current density of the ion beam 2 currently used is equal to or smaller than a predetermined value. If it is judged to be equal to or smaller than the predetermined value, the same ion implantation is continued without changing anything. In contrast to this, if it is judged to be greater than the predetermined value, ion implantation is stopped temporarily and information on the implantation stop is sent to the ion source regulator 15. The ion source regulator 15 receives the implantation-stop information and then re-regulates the beam current and the beam current density of the ion beam 2. Thereafter, if the maximum beam current density of the ion beam 2 satisfies the predetermined value, ion implantation is started again.

As described above, in general, during ion implantation, the beam current varies due to fluctuation or the like caused in the ion source 1. The rear Faraday cage 8 obtains, in real time, information on its variation and sends the obtained information to the beam current/current density measuring instrument 10. Simultaneously with this, the beam-scanning-speed measuring instrument 20 and the platen-moving-speed measuring instrument 21 continue to send the obtained scanning speed of the ion beam 2 and the obtained moving speed of the platen 17 to the beam current/current density measuring instrument 10, respectively The beam current/current density measuring instrument 10 determines, from the information on variation of the ion beam 2, the scanning speed of the ion beam 2, and the moving speed of the platen 17, whether or not the beam current density is a suitable value. Thereby, control of the system is continued.

Figure 8:
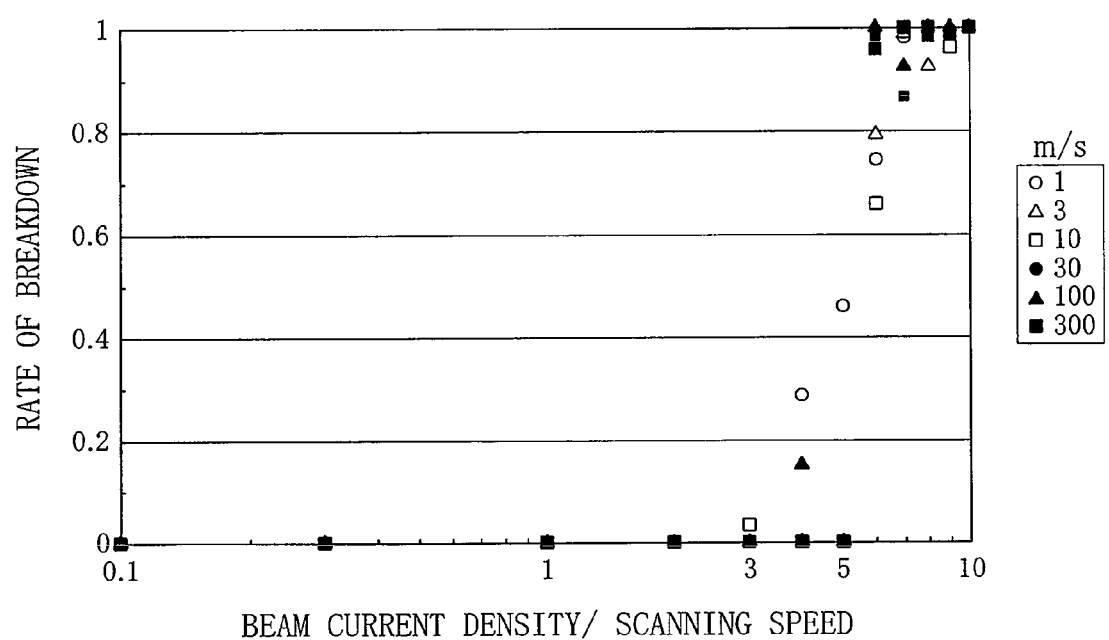
FIG. 8 is a graph showing the relation between the maximum beam current density of a beam standardized by the scanning speed and the rate of breakdown of a gate insulating film, which is obtained from the semiconductor manufacturing apparatus according to the fourth embodiment of the present invention.
Figure 9A:
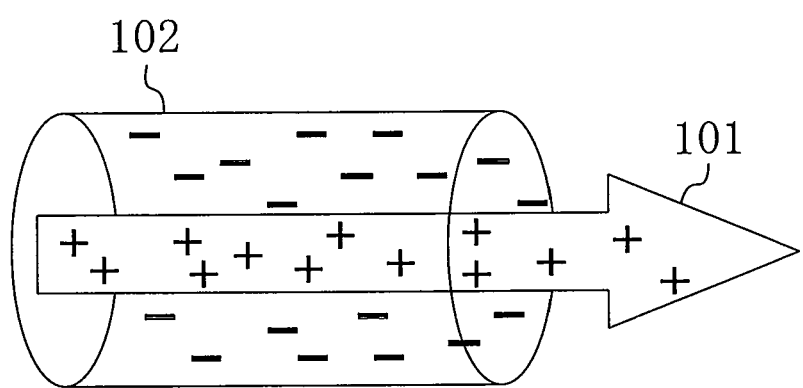
FIG. 9A is a schematic view showing the positional relation between an ion beam and electrons produced by a flood gun.
Figure 9B:
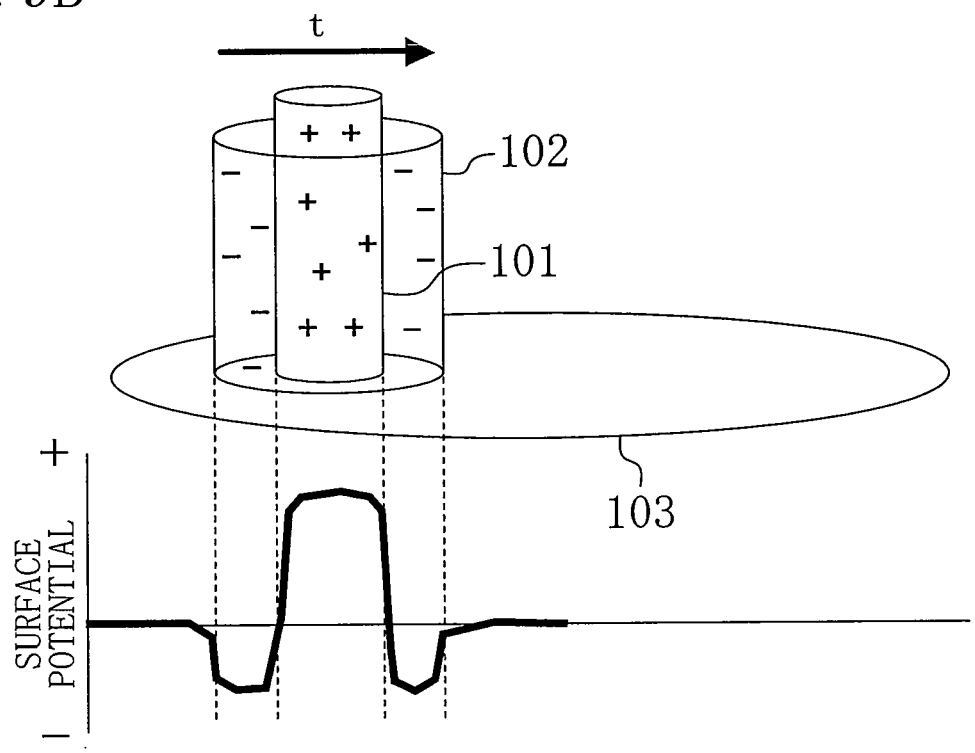
FIG. 9B is a schematic view showing the potential of a wafer surface when the ion beam and the surrounding electrons produced by the flood gun scan the wafer surface.
Figure 10A:
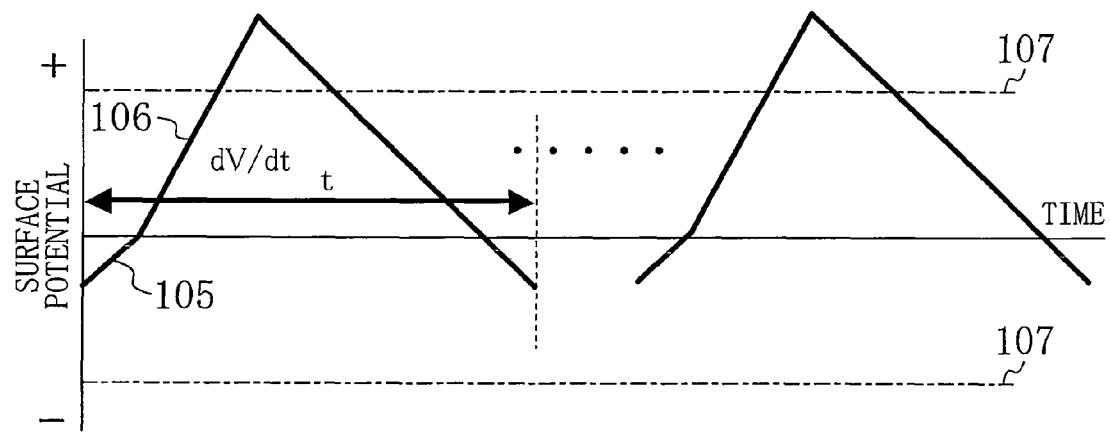
FIG. 10A is a graph of a conventional example showing the relation between potential variation on the wafer surface and the maximum breakdown voltage in the case where the wafer is scanned with the ion beam in FIG. 9B and the surrounding electrons produced by the flood gun.
Figure 10B:
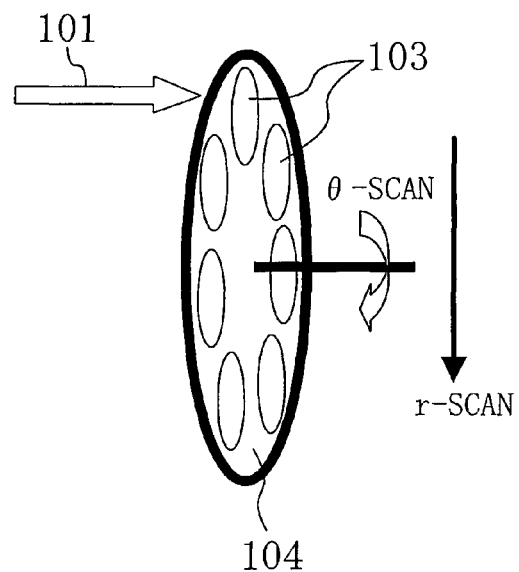
FIG. 10B is a schematic perspective view showing an exemplary ion-beam scanning method according to the conventional example.
Figure 11A:
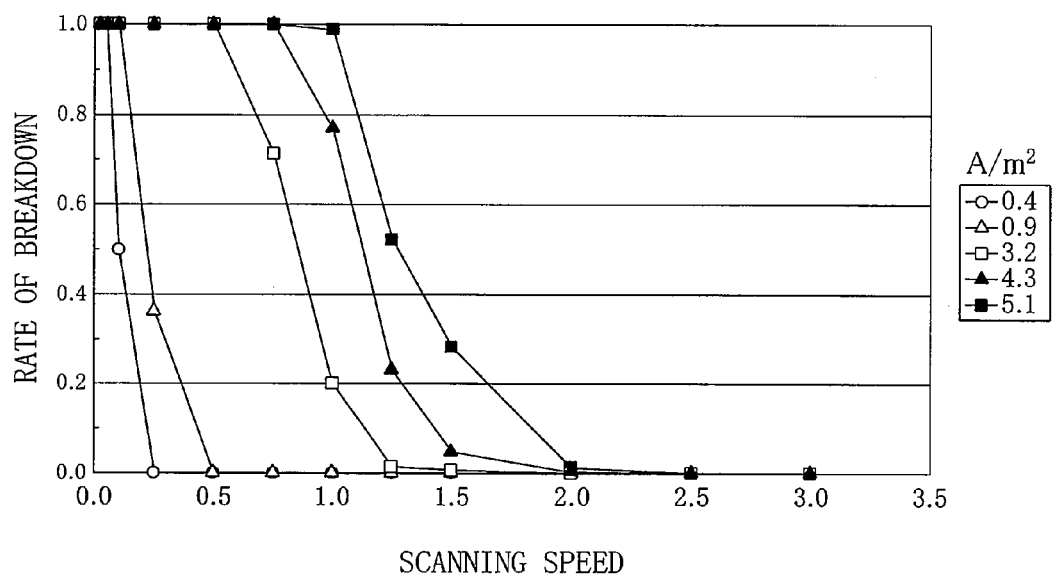
FIG. 11A is a graph showing the concept of the present invention, which illustrates the rate of breakdown of a gate insulating film on a wafer in the case where the relative speed of an ion beam to the wafer and the maximum beam current density of the ion beam are changed according to various conditions.
Figure 11B:
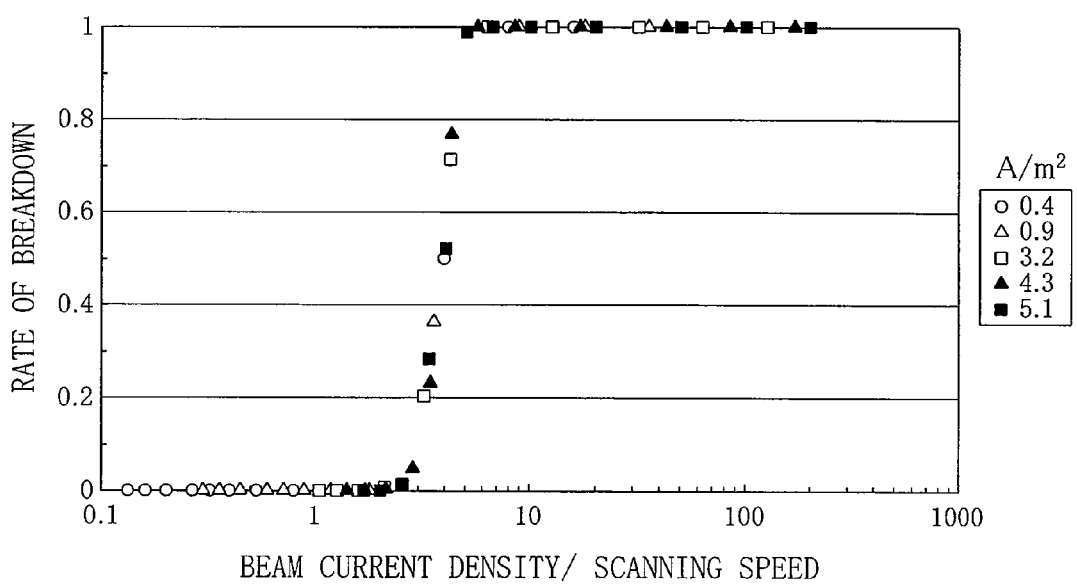
FIG. 11B is a graph showing the concept of the present invention, which illustrates the relation between the beam current density standardized by the scanning speed and the rate of breakdown of the gate insulating film on the wafer.

FIG. 8 is a graph showing the relation between the maximum beam current density standardized by the scanning speed and the rate of breakdown of the gate insulating film. FIG. 8 shows the result of the relation measured by changing the upper limit value of the scanning speed (relative speed) to 1 m/s, 3 m/s, 10 m/s, 30 m/s, 100 m/s, and 300 m/s in the case where as the ion implantation condition, for example, an arsenic (As$^+$) ion is used as the ion species and the ion acceleration energy is set at 20 keV. The horizontal axis of the graph represents the value obtained by dividing the maximum current density of the ion beam 2 during the ion implantation by the upper limit value of the scanning speed, and the vertical axis thereof represents the rate of breakdown of the gate oxide film.

As can be seen from FIG. 8, if the value obtained by dividing the maximum beam current density of the ion beam 2 by the upper limit value of the scanning speed is 5 or smaller, breakdown of the gate oxide film can be suppressed. Moreover, if the obtained value is 3 or smaller, breakdown of the gate insulating film can be nearly completely prevented.

That is to say, from the relation obtained by the equation (1), by setting the maximum current density of the ion beam 2 at 5v (A/m$^2$) or smaller (where v is the relative speed (m/s) of the ion beam 2 to the wafer 50), positive charge build-up by the ion beam 2 can be suppressed to prevent breakdown of the gate insulating film.

In the fourth embodiment, description has been made of the case where the ion implantation apparatus is used as an example. However, the apparatus used is not limited to this, and the same effects can be provided to an apparatus for introducing impurities with charges.

In the fourth embodiment, as the ion implantation condition, As$^+$ is used as the ion species, and the ion acceleration energy is set at 20 keV. However, the ion implantation condition is not limited to this, the ion species, the ion acceleration energy, and the amount of ion implantation can be modified as appropriate.

As described above, the semiconductor manufacturing apparatus according to the present invention can suppress, regardless of an ion beam scanning method employed, positive charge build-up of the semiconductor device having the insulating film formed on the semiconductor substrate. Therefore, the present invention is useful for a semiconductor manufacturing apparatus and the like for introducing impurities into a semiconductor device having an insulating film.

What is claimed is:

1. A method for manufacturing a semiconductor device, the method comprising:
    an impurity introduction step of introducing impurities with charges into a target film which is formed over a semiconductor substrate with an insulating film interposed therebetween;
    an electron supply step of supplying the target film with electrons for neutralizing the charges contained in the impurities;
    a scanning step of subjecting the target film to mechanical scanning of the impurities in two directions composed of X-Y directions or r-θ directions;
    a current density measurement step of measuring the current density J (A/m$^2$) produced by the impurities;
    a scanning speed changing changing the scanning speed of the target film; and
    a scanning speed control step of controlling, according to the current density J (A/m$^2$), the scanning speed of the target film.

2. The method of claim 1,
    wherein the scanning speed control step controls, according to the current density J (A/m$^2$), the scanning speed of the target film to a predetermined value or more.

3. The method of claim 2,
    wherein the predetermined value of the scanning speed is J/5 (m/s).

4. The method of claim 1,
    wherein the impurity introduction step is an ion implantation step of implanting ions as the impurities.

5. The method of claim 1, further comprising:
    an electronic energy control step of controlling energies of electrons supplied by the electron supply step; and
    an electronic energy measurement step of measuring energies of electrons supplied by the electron supply step.

6. The method of claim 5,
    wherein the electronic energy measurement step measures the maximum energy of electrons supplied by the electron supply step.

7. The method of claim 5,
    wherein the electronic energy measurement step controls the maximum energy of electrons supplied by the electron supply step based on the measured electron energy so that the maximum energy of electrons is set at a predetermined value or less.

8. The method of claim 1,
    wherein the insulating film has a thickness of t (nm), and the electronic energy control step controls the maximum electron energy to a value greater than 0 (eV) and not greater than 2t (eV).

9. A method for manufacturing a semiconductor device, the method comprising:
    an impurity introduction step of introducing impurities with charges into a target film which is formed over a semiconductor substrate with an insulating film interposed therebetween;
    an electron supply step of supplying the target film with electrons for neutralizing the charges contained in the impurities;
    a scanning step of subjecting the target film to mechanical scanning of the impurities in two directions composed of X-Y directions or r-θ directions;
    a current density measurement step of measuring the current density produced by the impurities;

a scanning speed measurement step of measuring the scanning speed v (m/s) of the target film;

a scanning speed control step of controlling the scanning speed of the target film;

a first current density control step of controlling the amount of generation of the impurities and the current density produced by the impurities; and a second current density control step of controlling the current density according to the scanning speed v (m/s).

10. The method of claim 9, wherein the second current density control step controls, according to the scanning speed v (m/s), the impurity current density to a value greater than zero and not greater than a predetermined value.

11. The method of claim 10, wherein the predetermined value of the current density is 5v (A/m$^2$).

12. The method of claim 9, wherein if the current density is greater than 5v (A/m$^2$), the second current density control step temporarily stops the impurity introduction operation, and when the current density is controlled to a value equal to or smaller than 5v (A/m$^2$), the impurity introduction operation is started again.

13. The method of claim 9, wherein the impurity introduction step is an ion implantation step of implanting ions as the impurities.

14. The method of claim 9, further comprising:

an electronic energy control step of controlling energies of electrons supplied by the electron supply step; and an electronic energy measurement step of measuring energies of electrons supplied by the electron supply step.

15. The method of claim 14, wherein the electronic energy measurement step measures the maximum energy of electrons supplied by the electron supply step.

16. The method of claim 14, wherein the electronic energy measurement step controls the maximum energy of electrons supplied by the electron supply step based on the measured electron energy so that the maximum energy of electrons is set at a predetermined value or less.

17. The method of claim 9, wherein the insulating film has a thickness of t (nm), and the electronic energy control step controls the maximum electron energy to a value greater than 0 (eV) and not greater than 2t (eV).

18. A method for manufacturing a semiconductor device, the method comprising:

an impurity introduction step of for introducing impurities with charges into a target film which is formed over a semiconductor substrate with an insulating film interposed therebetween;

an electron supply step of supplying the target film with electrons for neutralizing the charges contained in the impurities;

a first scanning step of subjecting the target film to mechanical scanning of the impurities in one direction;

a first scanning speed changing step of changing the scanning speed of the target film;

a second scanning step of allowing the impurities to perform scanning in the vertical direction with respect to one said direction;

a second scanning speed changing step of changing the scanning speed of the impurities;

a current density measurement step of measuring the current density J (A/m$^2$) produced by the impurities; and a scanning speed control step of controlling, according to the current density J (A/m$^2$), the scanning speed of the target film and the scanning speed of the impurities.

19. The method of claim 18, wherein the scanning speed control step controls, according to the current density J (A/m$^2$), the scanning speed of the impurities to a predetermined value or more.

20. The method of claim 19, wherein the predetermined value of the scanning speed is J/5 (m/s).

21. The method of claim 18, wherein the scanning speed control step controls, according to the current density J (A/m$^2$) of the impurities, the scanning speed of the impurities and the scanning speed of the target film to a predetermined value or greater.

22. The method of claim 18, wherein the scanning speed control step controls the relative speed of the impurities to the target film to a value of J/5 (m/s) or higher, the relative speed being determined by the scanning speed of the impurities and the scanning speed of the target film.

23. The method of claim 18, wherein the impurity introduction step is an ion implantation step for implanting ions as the impurities.

24. The method of claim 18, further comprising:

an electronic energy control step for controlling energies of electrons supplied by the electron supply step; and an electronic energy measurement step for measuring energies of electrons supplied by the electron supply step.

25. The method of claim 24, wherein the electronic energy measurement step measures the maximum energy of electrons supplied by the electron supply step.

26. The method of claim 24, wherein the electronic energy measurement step controls the maximum energy of electrons supplied by the electron supply step based on the measured electron energy so that the maximum energy of electrons is set at a predetermined value or less.

27. The method of claim 18, wherein the insulating film has a thickness of t (nm), and the electronic energy control step controls the maximum electron energy to a value greater than 0 (eV) and not greater than 2t (eV).

28. A method for manufacturing a semiconductor device, the method comprising:

an impurity introduction step of introducing impurities with charges into a target film which is formed over a semiconductor substrate with an insulating film interposed therebetween;

an electron supply step of supplying the target film with electrons for neutralizing the charges contained in the impurities;

a first scanning step of subjecting the target film to mechanical scanning of the impurities in one direction;

an first scanning speed measurement step of measuring the scanning speed of the target film;

a first scanning speed control step of controlling the scanning speed of the target film;

a second scanning step of allowing the impurities to perform scanning in the vertical direction with respect to one said direction;

a second scanning speed measurement step of measuring the scanning speed of the impurities;

a second scanning speed control step of controlling the scanning speed of the impurities;

first current density control step of controlling the amount of generation of the impurities and the current density produced by the impurities; and
a second current density control step of controlling the impurity current density according to the relative speed v (m/s) of the impurities to the target film determined by the scanning speed of the impurities and the scanning speed of the target film.

29. The method of claim 28,
wherein the second current density control step controls, according to the relative speed v (m/s), the impurity current density to a value greater than zero and not greater than a predetermined value.

30. The method of claim 28,
wherein the first current density control step controls the current density produced by the impurities to 5v (A/m$^2$) or smaller.

31. The method of claim 28,
wherein if the current density is greater than 5v (A/m$^2$), the second current density control step temporarily stops the impurity introduction operation, and when the current density is controlled to a value equal to or smaller than 5v (A/m$^2$), the impurity introduction operation is started again.

32. The method of claim 28,
wherein the impurity introduction step is an ion implantation step of implanting ions as the impurities.

33. The method of claim 28, further comprising:
an electronic energy control step of controlling energies of electrons supplied by the electron supply step; and
an electronic energy measurement step of measuring energies of electrons supplied by the electron supply step.

34. The method of claim 33,
wherein the electronic energy measurement step measures the maximum energy of electrons supplied by the electron supply step.

35. The method of claim 33,
wherein the electronic energy measurement step controls the maximum energy of electrons supplied by the electron supply step based on the measured electron energy so that the maximum energy of electrons is set at a predetermined value or less.

36. The method of claim 28,
wherein the insulating film has a thickness of t (nm), and
the electronic energy control step controls the maximum electron energy to a value greater than 0 (eV) and not greater than 2t (eV).

* * * * *